(12) United States Patent
White et al.

(10) Patent No.: US 9,580,804 B2
(45) Date of Patent: Feb. 28, 2017

(54) DIFFUSER SUPPORT

(75) Inventors: John M. White, Hayward, CA (US);
Robin L. Tiner, Santa Cruz, CA (US);
Yeh Kurt Chang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 619 days.

(21) Appl. No.: 12/749,172

(22) Filed: Mar. 29, 2010

(65) Prior Publication Data

US 2010/0181024 A1 Jul. 22, 2010

Related U.S. Application Data

(63) Continuation of application No. 11/767,307, filed on Jun. 22, 2007, now abandoned.

(51) Int. Cl.
| | | |
|---|---|---|
| C23C 16/00 | (2006.01) | |
| C23F 1/00 | (2006.01) | |
| H01L 21/306 | (2006.01) | |
| C23C 16/455 | (2006.01) | |

(52) U.S. Cl.
CPC .............................. C23C 16/45565 (2013.01)

(58) Field of Classification Search
USPC ..................................... 156/345.34; 118/715
See application file for complete search history.

(56) References Cited

U.S. PATENT DOCUMENTS

| | | |
|---|---|---|
| 3,830,194 A | 8/1974 | Benzing et al. |
| 4,455,467 A | 6/1984 | Dills |
| 4,522,149 A | 6/1985 | Garbis et al. |
| 4,563,367 A | 1/1986 | Sherman |
| 4,792,378 A | 12/1988 | Rose et al. |
| 4,809,421 A | 3/1989 | Justice |
| 4,927,991 A | 5/1990 | Wendt et al. |
| 4,993,358 A | 2/1991 | Mahawili |
| 5,000,113 A | 3/1991 | Wang et al. |
| 5,044,943 A | 9/1991 | Bowman et al. |
| 5,124,635 A | 6/1992 | Henley |
| 5,173,580 A | 12/1992 | Levin et al. |
| 5,332,443 A | 7/1994 | Chew et al. |
| 5,399,387 A | 3/1995 | Law et al. |
| 5,421,893 A | 6/1995 | Perlov |

(Continued)

FOREIGN PATENT DOCUMENTS

| | | |
|---|---|---|
| CN | 1758826 A | 4/2006 |
| EP | 0843348 A2 | 5/1998 |

(Continued)

OTHER PUBLICATIONS

First Office Action for Chineese Application No. 200810126948.6 Dated Mar. 10, 2010.

(Continued)

*Primary Examiner* — Keath Chen
(74) *Attorney, Agent, or Firm* — Patterson & Sheridan, LLP

(57) ABSTRACT

Embodiments of gas distribution apparatus comprise a diffuser support member coupled to a diffuser and movably disposed through a backing plate. Embodiments of methods of processing a substrate on a substrate receiving surface of a substrate support comprise providing a diffuser in which a diffuser support member supports the diffuser and is movably disposed through the backing plate.

19 Claims, 8 Drawing Sheets

(56) References Cited

U.S. PATENT DOCUMENTS

| | | |
|---|---|---|
| 5,439,524 A | 8/1995 | Cain et al. |
| 5,500,256 A | 3/1996 | Watabe et al. |
| 5,567,243 A | 10/1996 | Foster et al. |
| 5,582,866 A | 12/1996 | White |
| 5,611,865 A | 3/1997 | White et al. |
| 5,614,026 A | 3/1997 | Williams |
| 5,614,055 A | 3/1997 | Fairbairn et al. |
| 5,628,829 A | 5/1997 | Foster et al. |
| 5,628,869 A | 5/1997 | Mallon |
| 5,647,911 A | 7/1997 | Vanell et al. |
| 5,714,408 A | 2/1998 | Ichikawa et al. |
| 5,766,364 A | 6/1998 | Ishida et al. |
| 5,819,434 A | 10/1998 | Herchen et al. |
| 5,820,686 A | 10/1998 | Moore |
| 5,844,205 A | 12/1998 | White et al. |
| 5,846,332 A | 12/1998 | Zhao et al. |
| 5,854,263 A | 12/1998 | Glamkowski et al. |
| 5,876,838 A | 3/1999 | Mallon |
| 5,882,411 A | 3/1999 | Zhao et al. |
| 5,928,732 A | 7/1999 | Law et al. |
| 5,950,925 A | 9/1999 | Fukunaga et al. |
| 5,968,276 A | 10/1999 | Lei et al. |
| 5,990,016 A | 11/1999 | Kim et al. |
| 5,994,678 A | 11/1999 | Zhao et al. |
| 5,997,649 A | 12/1999 | Hillman |
| 6,024,799 A | 2/2000 | Chen et al. |
| 6,030,508 A | 2/2000 | Yang et al. |
| 6,040,022 A | 3/2000 | Chang et al. |
| 6,041,733 A | 3/2000 | Kim et al. |
| 6,050,506 A | 4/2000 | Guo et al. |
| 6,079,356 A | 6/2000 | Umotoy et al. |
| 6,113,700 A | 9/2000 | Choi et al. |
| 6,123,775 A | 9/2000 | Hao et al. |
| 6,140,255 A | 10/2000 | Ngo et al. |
| 6,149,365 A | 11/2000 | White et al. |
| 6,150,283 A | 11/2000 | Ishiguro et al. |
| 6,170,432 B1 | 1/2001 | Szapucki et al. |
| 6,182,603 B1 | 2/2001 | Shang et al. |
| 6,197,151 B1 | 3/2001 | Kaji et al. |
| 6,203,622 B1 | 3/2001 | Halpin et al. |
| 6,228,438 B1 | 5/2001 | Schmitt et al. |
| 6,232,218 B1 | 5/2001 | Cathey et al. |
| 6,254,742 B1 | 7/2001 | Hanson et al. |
| 6,281,469 B1 | 8/2001 | Perrin et al. |
| 6,302,057 B1 | 10/2001 | Leusink et al. |
| 6,338,874 B1 | 1/2002 | Law et al. |
| 6,344,420 B1 | 2/2002 | Miyajima et al. |
| 6,364,949 B1 | 4/2002 | Or et al. |
| 6,371,712 B1 | 4/2002 | White et al. |
| 6,383,573 B1 | 5/2002 | Beck et al. |
| 6,447,980 B1 | 9/2002 | Rahman et al. |
| 6,454,855 B1 | 9/2002 | Von Kanel et al. |
| 6,477,980 B1 * | 11/2002 | White et al. .............. 118/723 E |
| 6,502,530 B1 | 1/2003 | Turlot et al. |
| 6,527,908 B2 | 3/2003 | Kanetsuki et al. |
| 6,548,112 B1 | 4/2003 | Hillman et al. |
| 6,556,536 B1 | 4/2003 | Reynolds et al. |
| 6,566,186 B1 | 5/2003 | Allman et al. |
| 6,593,548 B2 | 7/2003 | Matsumura et al. |
| 6,596,576 B2 | 7/2003 | Fu et al. |
| 6,616,766 B2 | 9/2003 | Dunham |
| 6,619,131 B2 | 9/2003 | Walchli et al. |
| 6,626,988 B1 | 9/2003 | Schmalstieg et al. |
| 6,626,998 B1 | 9/2003 | Dunham |
| 6,631,692 B1 | 10/2003 | Matsuki et al. |
| 6,663,025 B1 | 12/2003 | Jacob et al. |
| 6,664,202 B2 | 12/2003 | Tang et al. |
| 6,682,630 B1 | 1/2004 | Colpo et al. |
| 6,683,216 B1 | 1/2004 | Zoeller et al. |
| 6,740,367 B2 | 5/2004 | Matsuki et al. |
| 6,756,324 B1 | 6/2004 | Gates |
| 6,772,827 B2 | 8/2004 | Keller et al. |
| 6,793,733 B2 | 9/2004 | Janakiraman et al. |
| 6,814,838 B2 | 11/2004 | Weichart et al. |
| 6,821,347 B2 | 11/2004 | Carpenter et al. |
| 6,852,168 B2 | 2/2005 | Park et al. |
| 6,873,764 B2 | 3/2005 | Maisenholder et al. |
| 6,881,684 B2 | 4/2005 | Aota et al. |
| 6,916,407 B2 | 7/2005 | Voser et al. |
| 6,918,352 B2 | 7/2005 | Von Kanel et al. |
| 6,924,241 B2 | 8/2005 | Lee |
| 6,942,753 B2 | 9/2005 | Choi et al. |
| 6,961,490 B2 | 11/2005 | Maisenhoelder et al. |
| 7,125,758 B2 | 10/2006 | Choi et al. |
| 7,238,623 B2 * | 7/2007 | Garcia .................. 438/758 |
| 2001/0023742 A1 | 9/2001 | Schmitt |
| 2002/0006478 A1 | 1/2002 | Yuda et al. |
| 2002/0011215 A1 | 1/2002 | Tei et al. |
| 2002/0129769 A1 | 9/2002 | Kim et al. |
| 2002/0146879 A1 | 10/2002 | Fu et al. |
| 2002/0189545 A1 | 12/2002 | Matsumura et al. |
| 2003/0071035 A1 * | 4/2003 | Brailove .................. 219/672 |
| 2003/0089314 A1 | 5/2003 | Matsuki et al. |
| 2003/0170388 A1 | 9/2003 | Shinriki et al. |
| 2003/0199175 A1 | 10/2003 | Tang et al. |
| 2004/0011910 A1 | 1/2004 | Ishii et al. |
| 2004/0043637 A1 | 3/2004 | Aota et al. |
| 2004/0129211 A1 | 7/2004 | Blonigan et al. |
| 2004/0145383 A1 | 7/2004 | Brunner |
| 2004/0228141 A1 | 11/2004 | Hay et al. |
| 2004/0250955 A1 | 12/2004 | Blonigan et al. |
| 2005/0066898 A1 | 3/2005 | Schmitt et al. |
| 2005/0133161 A1 | 6/2005 | Carpenter et al. |
| 2005/0183827 A1 | 8/2005 | White et al. |
| 2005/0199182 A1 | 9/2005 | Masuda et al. |
| 2005/0223986 A1 | 10/2005 | Choi et al. |
| 2005/0251990 A1 | 11/2005 | Choi et al. |
| 2005/0255257 A1 | 11/2005 | Choi et al. |
| 2005/0271812 A1 * | 12/2005 | Myo et al. .................. 427/248.1 |
| 2006/0005771 A1 | 1/2006 | White et al. |
| 2006/0045322 A1 | 3/2006 | Clarke et al. |
| 2006/0054280 A1 | 3/2006 | Jang |
| 2006/0060138 A1 | 3/2006 | Keller et al. |
| 2006/0201074 A1 * | 9/2006 | Kurita et al. .................. 52/79.1 |
| 2006/0228496 A1 | 10/2006 | Choi et al. |
| 2006/0236934 A1 | 10/2006 | Choi et al. |

FOREIGN PATENT DOCUMENTS

| | | |
|---|---|---|
| EP | 0985742 A2 | 3/2000 |
| EP | 1118693 A2 | 7/2001 |
| EP | 1167570 A1 | 1/2002 |
| EP | 1168427 A1 | 1/2002 |
| EP | 1321538 A2 | 6/2003 |
| EP | 1386981 A1 | 2/2004 |
| JP | 60025235 A | 2/1985 |
| JP | 63187619 A | 8/1988 |
| JP | 01004481 A | 1/1989 |
| JP | 01149964 | 6/1989 |
| JP | 03122281 A | 5/1991 |
| JP | 08055802 A | 2/1996 |
| JP | 2002064084 A | 2/2002 |
| JP | 2005086208 A | 3/2005 |
| KR | 200692886 | 8/2006 |
| WO | WO-9533866 A1 | 12/1995 |
| WO | WO-9925012 A1 | 5/1999 |
| WO | WO-9925895 A1 | 5/1999 |
| WO | WO-0183852 A1 | 11/2001 |
| WO | WO-03015481 A2 | 2/2003 |
| WO | WO-03078681 A1 | 9/2003 |

OTHER PUBLICATIONS

Notice to File a Response for Korean Application No. 10-2008-0057715 Dated May 25, 2010.
S.K. Kim, et al. "A Novel Self-Aligned Coplanar Amorphous Silicon Thin Film Transistor," ISSN0098-0966X/98/2901 (1998).
L. Kyung-Ha, "A Study on Laser Annealed Polycrystalline Silicon Thin Film Transistors (TFT's) with SiNx Gate Insulator," Kyung Hee University, Ch. 2 & 4 (1998).
M.A. Lieberman, et al. "Standing Wave and Skin Effects in Large-Area, High-Frequency Capacitive Discharges" Plasma Sources Sci. Technology, vol. 11, pp. 283-293 (2002).

(56) References Cited

OTHER PUBLICATIONS

Y. Park, "Bulk and Interface Properties of Low-Temperature Silicon Nitride Films Deposited by Remote Plasma Enhanced Chemical Vapor Deposition," Journal of Material Science: Materials in Electronics, vol. 12, pp. 515-522 (2001).

A. Sazonov, et al. "Low Temperature a-Si:H TFT on Plastic Films: Materials and Fabrication Aspects," Proc. 23rd International Conference on Microelectronics (MIEL 2002), vol. 2, Nis, Yugoslavia (May 2002).

D.B. Thomasson, et al. "High Mobility Tri-Layer a-Si:H Thin Film Transistors with Ultra-Thin Active Laer," (1997) Society of Information Display International Symposium Digest of Technical Papers, vol. 28, pp. 176-179.

Yue Kuo, "Plasma Enhanced Chemical Vapor Deposition Silicon Nitride as a Gate Dielectric Film for Amorhous Silicon Thin Film Transistors—A Critical Review" Vacuum, vol. 51, No. 4, pp. 741-745, Elsevier Science Ltd. (1998).

Lee, et al. "High Density Hollow Cathode Plasma Etching for Field Emission Display Applications" Journal of Information Display vol. 2, No. 4 (2002) pp. 1-7.

Anders, et al. "Working Principle of the Hollow-Anode Plasma Source" Lawrence Berkeley National Laboratory, USB pp. 1-10.

Anders, et al. "Characterization of a Low-Energy Constricted-Plasma Source" Ernest Orlando Lawrence Berkeley National Laboratory & Institute of Physics, Germany (Aug. 1997) pp. 1-11.

"13.56 MHz Hollow Cathode Plasma Source HCD-P 100" Plasma Consult Germany—Technical Note.

"13.56 MHz Hollow Cathode Plasma Source HCD-P 300" Plasma Consult Germany—Technical Note.

L. Bardos, et al. "Thin Film Processing by Radio Frequency Hollow Cathodes," Surface and Coatings Techonolgy (1997), pp. 723-728.

Official Letter dated Feb. 4, 2013 from the Chinese Patent Office for corresponding Chinese Patent Application No. 201110192142.9.

\* cited by examiner

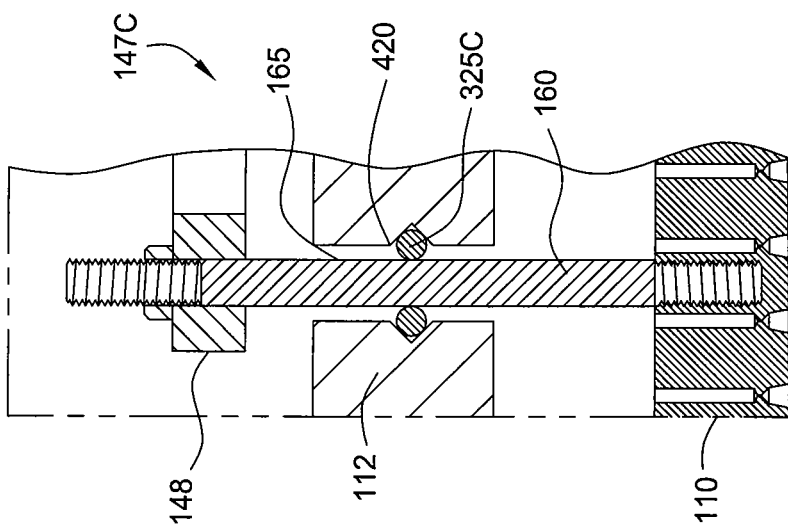
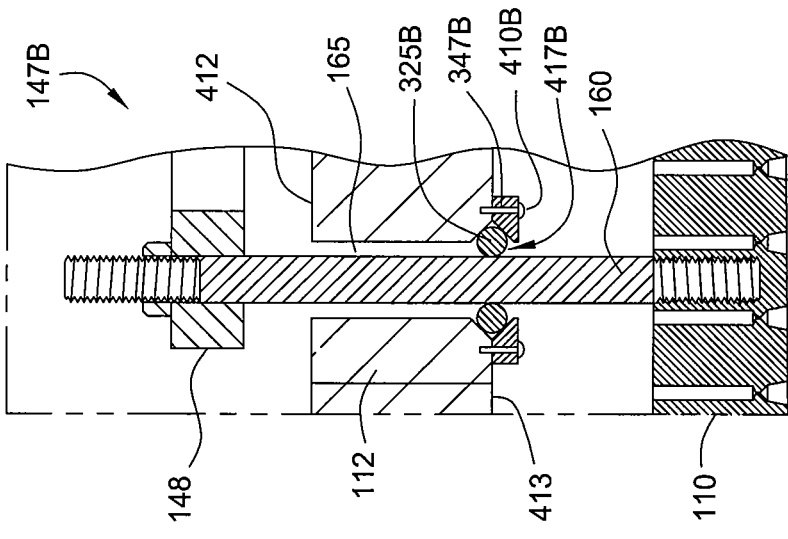
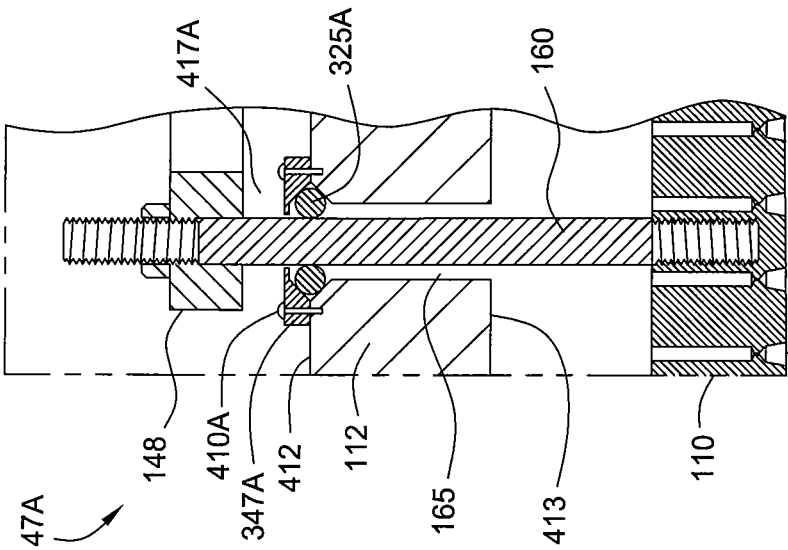
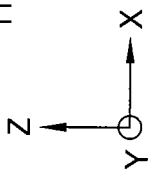

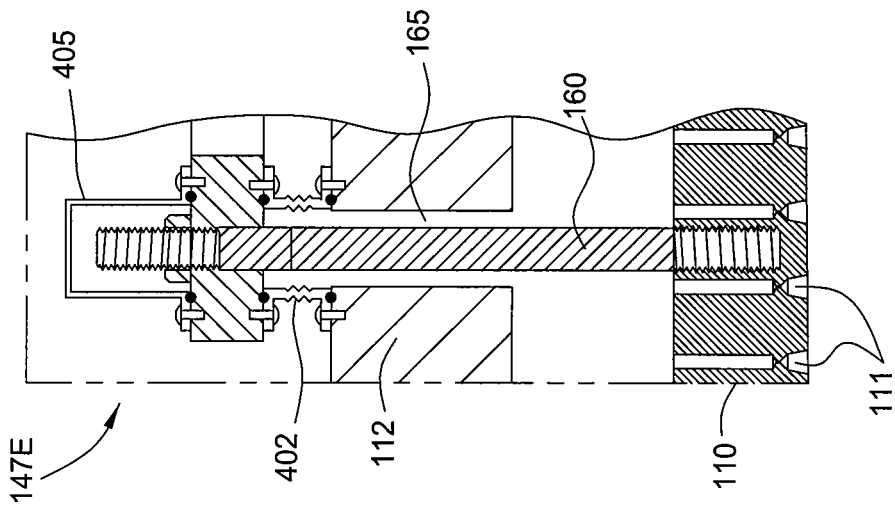
FIG. 4E
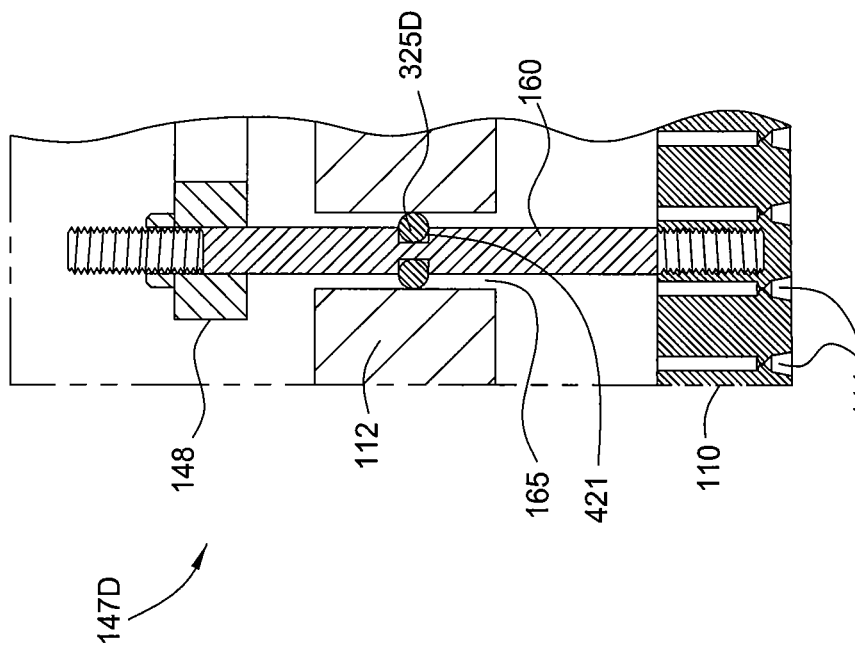
FIG. 4D
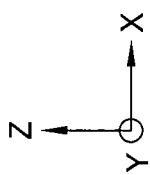

DIFFUSER SUPPORT

CROSS-REFERENCE TO RELATED APPLICATIONS

This application is a continuation of U.S. patent application Ser. No. 11/767,307, now abandoned filed Jun. 22, 2007, which is incorporated by reference herein.

BACKGROUND OF THE INVENTION

Field of the Invention

Embodiments of the present invention generally relate to apparatus and methods for supporting a gas distribution plate or diffuser.

Description of the Related Art

Substrates in which flat panel displays are made from have increased dramatically in size over recent years. For example, a substrate which is typically divided to make a plurality of TFT-LCD flat panel displays had sizes of about 2,000 $cm^2$ and have increased in size to about 25,000 $cm^2$ or larger. Such substrates are typically processed in a plasma chamber having a diffuser. The diffuser is generally supported in a spaced-apart relation facing the substrate with a plurality of gas passageways adapted to disperse one or more process gases toward the substrate to perform a process to the substrate, such as deposition or etch. This increase in substrate size has brought an increase in diffuser size since the diffuser is approximately the size of the substrate.

Problems with current diffusers include sagging, creeping, movement, and/or cracking of the diffuser or associated components over time, due to exposure of the diffuser to high processing temperatures, to the forces of gravity, and to other forces. Such problems with current diffuser designs may adversely affect substrate processing uniformity and properties and may increase maintenance and replacement costs of the diffuser and associated components.

Therefore, there is a need for an improved gas distribution apparatus and methods.

SUMMARY OF THE INVENTION

Embodiments of gas distribution apparatus comprise a diffuser support member coupled to a diffuser and movably disposed through a backing plate. Certain embodiments of gas distribution apparatus further comprise a chamber body including a bottom and walls. The backing plate is disposed over the chamber body. A chamber interior volume is bounded by the chamber body and the backing plate. The diffuser is disposed within the chamber interior volume. Other embodiments of gas distribution apparatus further comprise variable spacing between the backing plate and the diffuser.

Embodiments of methods of processing a substrate on a substrate receiving surface of a substrate support comprise providing a diffuser within a chamber interior volume bounded by a chamber body and a backing plate. A diffuser support member supports the diffuser and is movably disposed through the backing plate. In certain embodiments, a vacuum pressure is applied within the chamber interior volume in which the backing plate flexes in response to the vacuum pressure. In other embodiments, the diffuser support member is coupled to a structure outside of the chamber interior volume.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4E show various embodiments of sealing devices associated with the diffuser support members to providing a vacuum seal of the openings of the backing plate.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
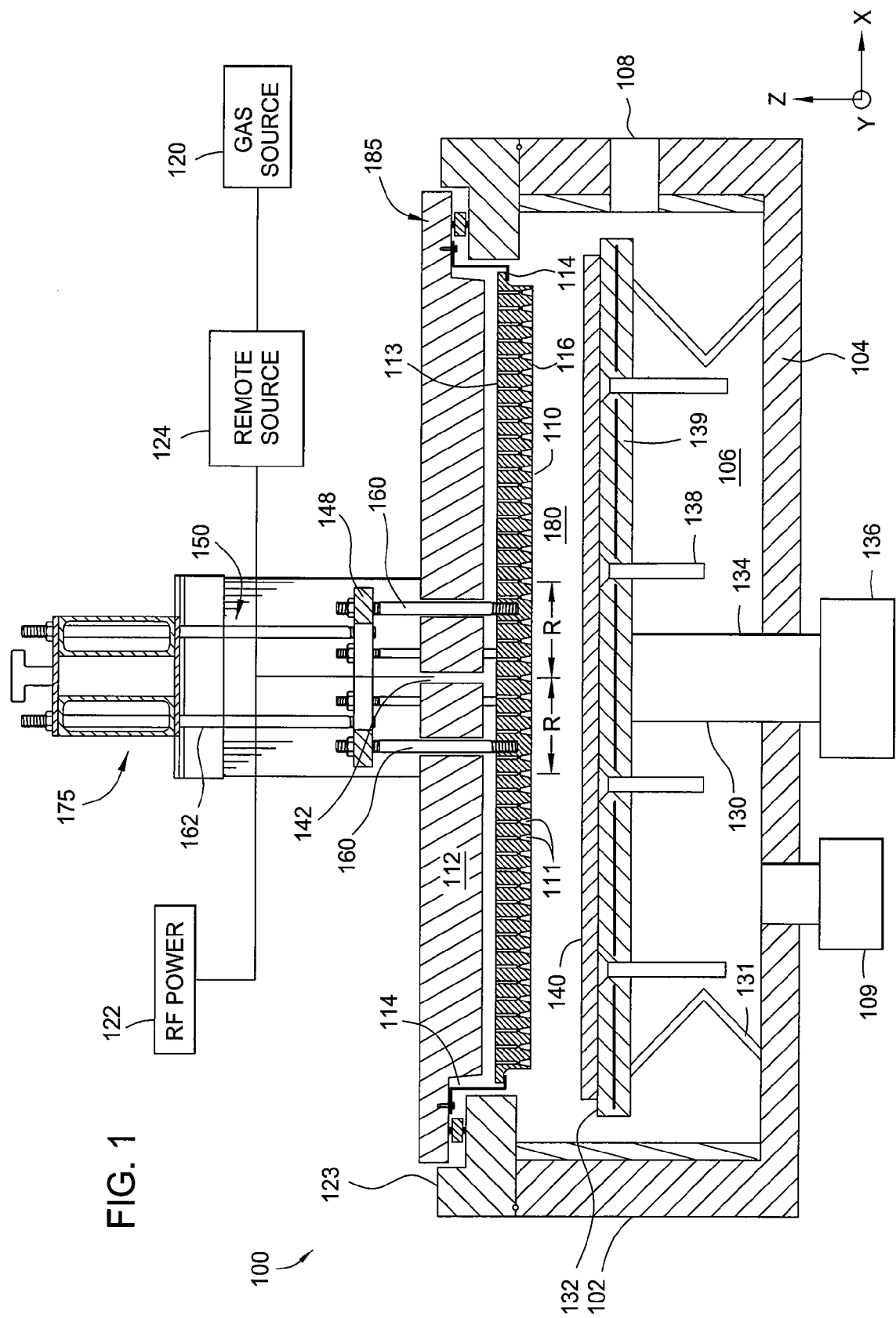
FIG. 1 is a schematic cross-sectional view of one embodiment of a diffuser supported in a chamber.

Embodiments of the present invention generally provide apparatus and methods for supporting a diffuser in a processing apparatus adapted to process the substrate, such as in a deposition, etch, plasma treatment, plasma clean, or other substrate process. FIG. 1 is a schematic cross-sectional view of one embodiment of a gas distribution apparatus comprising a diffuser 110 supported in a chamber 100, such as a plasma enhanced chemical vapor deposition (PECVD) chamber. One suitable PECVD chamber which may be used is available from Applied Materials, Inc., located in Santa Clara, Calif. or from subsidiaries of Applied Materials, Inc. It is understood that other chambers may benefit from the present apparatus and methods, such as an etch chamber, plasma treatment chamber, plasma clean chamber, and other chambers. The chamber shown in FIG. 1 is adapted to process substrates in a horizontal orientation. It is understood that the present apparatus and methods may also apply to chambers adapted to process substrates in other orientations, such as a vertical orientation.

The chamber 100 comprises a chamber body having walls 102 and a bottom 104. The chamber 100 also includes a backing plate 112 coupled to the lid 123 of the chamber 100. A chamber interior volume 106 is bounded by the chamber body and the backing plate 112. A substrate support 130 is disposed within the chamber interior volume 106. The chamber interior volume 106 is accessed through a sealable slit valve 108 so that a substrate 140 may be transferred in and out of the chamber 100. The substrate support 130 includes a substrate receiving surface 132 for supporting the substrate 140 and includes a stem 134 coupled to a lift system 136 to raise and lower the substrate support 130. A shadow ring (not shown) may be optionally placed over the periphery of the substrate 140. Lift pins 138 are movably disposed through the substrate support 130 to move the substrate 140 to and from the substrate receiving surface 132. The substrate support 130 may also include heating and/or cooling elements 139 to maintain the substrate support 130 at a desired temperature. The substrate support 130 may also include grounding straps 131 to provide radio frequency (RF) grounding at the periphery of the substrate support 130.

A gas source 120 is coupled to the backing plate 112 to provide one or more gases through a gas inlet 142 in the backing plate 112. The gas travels through the gas inlet 142 and through gas passages 111 in the diffuser 110 to a processing region 180 above the substrate 140. A vacuum pump 109 is coupled to the chamber 100 to control the chamber interior volume 106 and the processing region 180 at a desired pressure.

The diffuser 110 includes a first or upstream side 113 and a second or downstream side 116. Each of the gas passages 111 are formed through the diffuser 110 to allow gas transfer from the upstream side 113 to the downstream side 116 to the processing region 180. A radio frequency (RF) power source 122 may be coupled to the backing plate 112 to provide RF power to the diffuser 110. The backing plate 112, which is shown supported by the lid 123, may be electrically isolated from other portions of the chamber 100 by an insulator 185. The RF power applied to the diffuser creates an electric field between the diffuser 110 and the substrate support 130 so that a plasma may be generated from gases in the processing region 180. Various frequencies may be used, such as a frequency between about 0.3 MHz and about 200 MHz, such as a RF power provided at a frequency of 13.56 MHz.

A remote plasma source 124, such as an inductively coupled or microwave remote plasma source, may also be coupled between the gas source 120 and the gas inlet 142 formed in the backing plate 112. Between processing substrates, a cleaning gas may be provided to the remote plasma source 124 so that a remote plasma is generated and provided within the chamber 100 to clean chamber components. The cleaning gas may be further excited by RF current supplied by the RF power source 122 to the diffuser 110. Suitable cleaning gases include but are not limited to $NF_3$, $F_2$, and $SF_6$.

The diffuser 110 is coupled to the backing plate 112 at an edge portion of the diffuser 110 by a suspension 114. The suspension 114 may be flexible to allow expansion and contraction of the diffuser 110. In the embodiment shown in FIG. 1, the suspension 114 also transmits RF current from the backing plate 112 applied by the RF power source 122 to the diffuser 110. Examples of a flexible suspension are disclosed in U.S. Pat. No. 6,477,980, assigned to Applied Materials, Inc., incorporated by reference in its entirety to the extent not inconsistent with the present disclosure.

One or more diffuser support members 160 are movably disposed through respective openings 165 in backing plate 112 and are coupled to the diffuser 110. The diffuser support members 160 are coupled to a frame structure 175. The material of the diffuser support members 160 may be any process compatible material of sufficient strength to support the diffuser 110, such as metals, alloys, polymers, ceramics, aluminum, titanium, and combinations thereof. The diffuser supports 160 are preferably coupled to a center area of the diffuser 110. Since the diffuser support members 160 are movably disposed through the backing plate 112, the diffuser support members 160 may support the center area of diffuser 110 in any desired position independent of the position of the center area of the backing plate 112.

The center area of the diffuser 110 is defined herein as a location within a radius R from the center of the diffuser, wherein R is 25% or less of the diagonal of the diffuser, preferably 15% or less of the diagonal of the diffuser, more preferably 10% or less of the diagonal of the diffuser. For instance, if the dimensions of a diffuser are 2.3 meters in length and 2.0 meters in width, the diagonal would be about 3.0 meters.

As shown in FIG. 1, the diffuser support members 160 may be coupled to the frame structure 175 by a coupling assembly 150. The coupling assembly 150 may comprise a support ring 148 and one or more hangers 162. The hangers 162 are coupled to the frame structure 175 and to the support ring 148. The support ring 148 is coupled to the diffuser support members 160. In one embodiment, the support ring 148 may comprise a dielectric material, such as ceramic or polymer materials, to electrically isolate the frame structure 175 or reduce the amount of RF current traveling from the backing plate through the diffuser support members 160 to the frame structure 175. In other embodiments, the support ring 148 may comprise a conductive material, such as steel, aluminum, and other materials.

Figure 2:
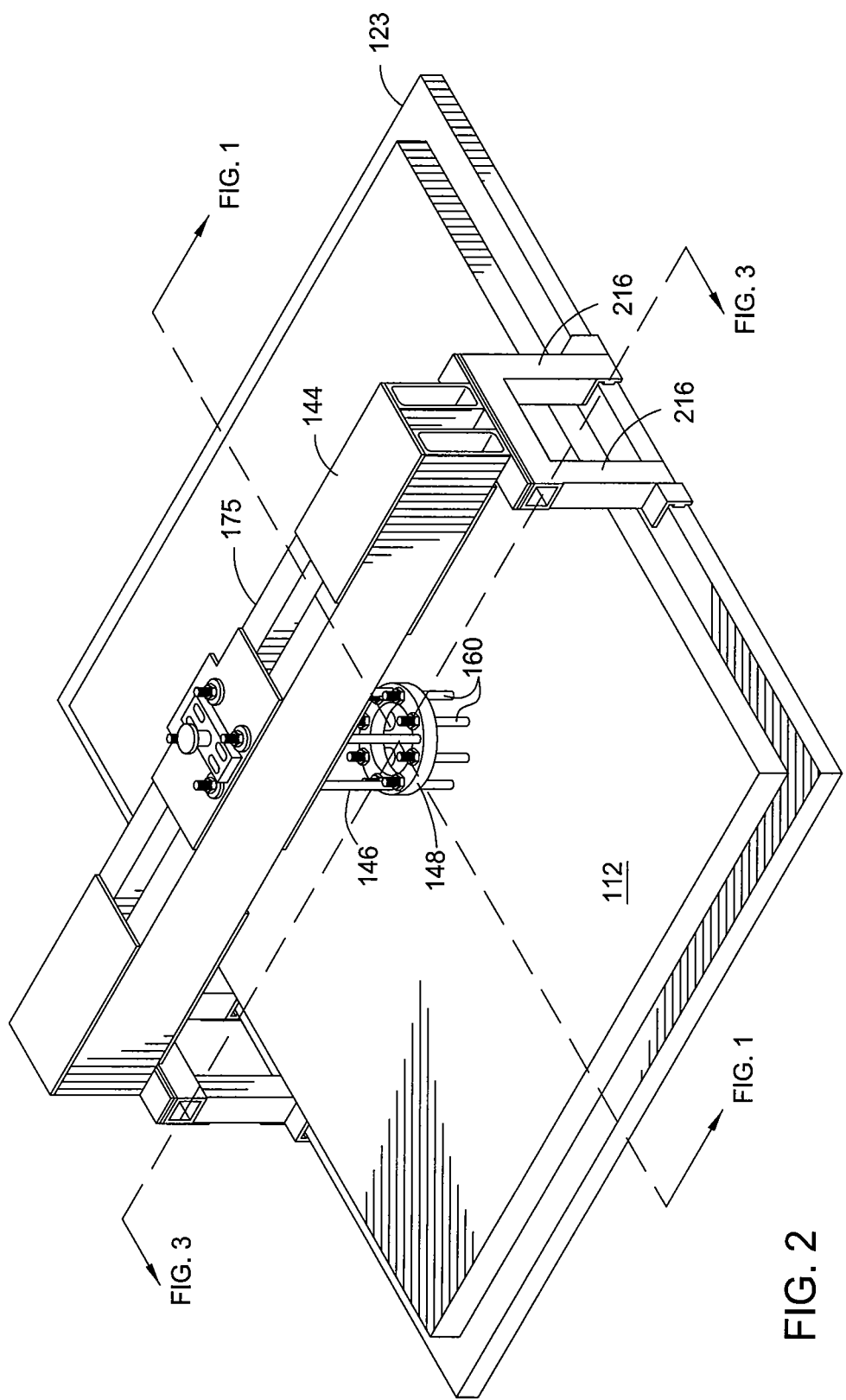
FIG. 2 is a top isometric view of the frame structure of FIG. 1.

FIG. 2 is a top isometric view of the frame structure 175 of FIG. 1. The frame structure 175 is disposed above the backing plate 112 and is coupled to the lid 123. In one aspect, the frame structure comprises a support structure 144 that is coupled to two or more support members 216 which space the frame structure 175 apart from the lid 123 and/or the backing plate 112. The support ring 148 is shown coupled to the frame structure 175 by one or more fasteners 146. While the support ring 148 is shown as an annular shape, other shapes may be used, which include polygonal shapes, oval shapes, and other simple or complex patterns and shapes.

Figure 3:
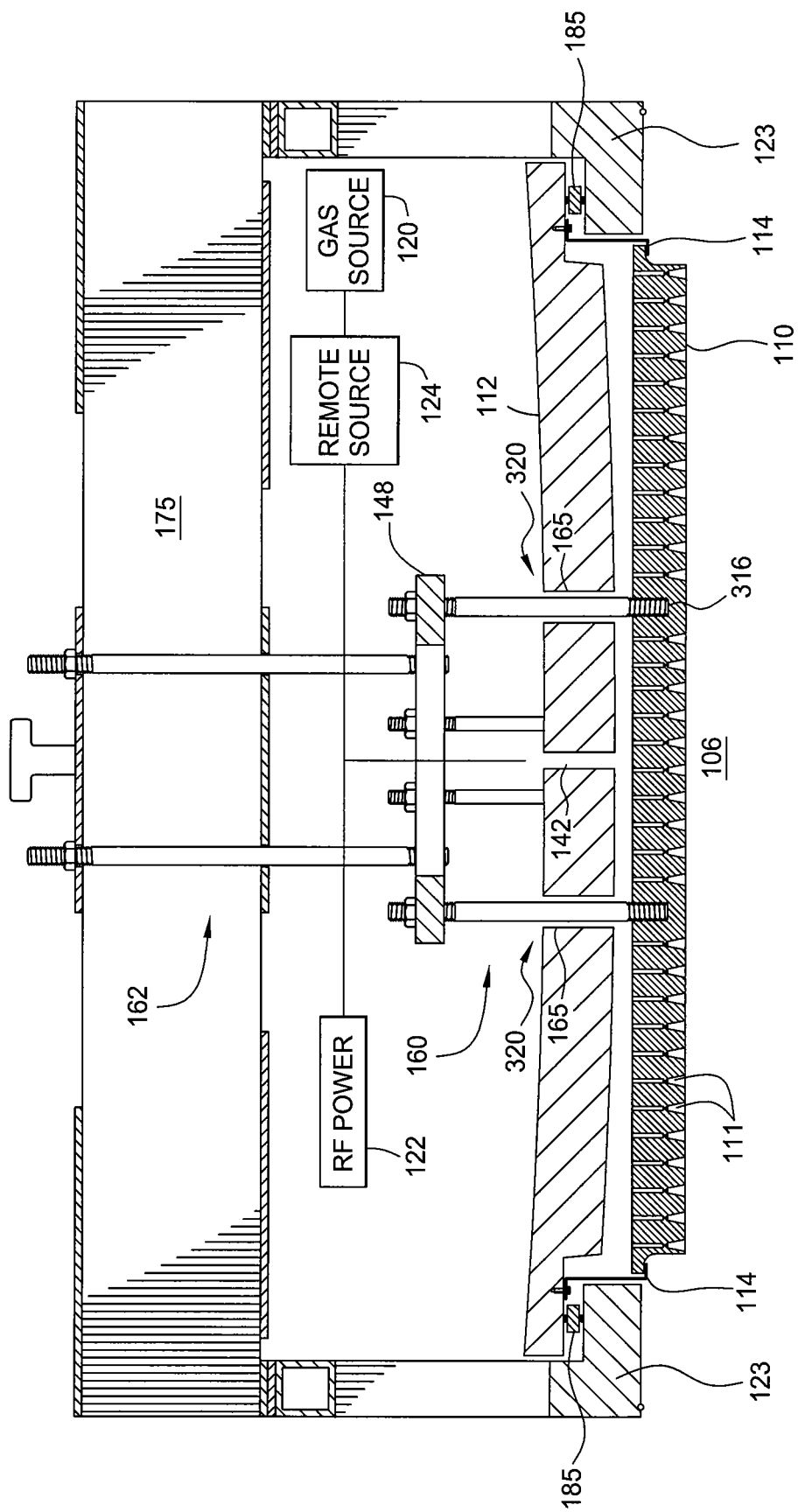
FIG. 3 is an enlarged schematic cross-sectional view of diffuser support member, the backing plate, and the diffuser of the chamber of FIG. 1 in which the backing plate is flexed.

FIG. 3 is an enlarged schematic cross-sectional view of diffuser support members 160, the backing plate 112, and the diffuser 110 of the chamber 100 of FIG. 1 in which the backing plate 112 is bowed or flexed. When a vacuum pressure is applied to the interior chamber volume 106, the backing plate 112 experiences a bow, flex, droop or sag due to the large differential in pressure between the interior chamber volume 106 and atmospheric pressure. As used herein the term "vacuum pressure" means a pressure of less than 760 Torr, preferably less than 100 Torr, more preferably less than 15 Torr. For example, a backing plate for a chamber to process substrates having a substrate surface area of 25,000 $cm^2$ or more may bow or flex a couple of millimeters due to the vacuum pressure applied to it. In comparison, a typical plasma process may require a controlled spacing between the diffuser 110 and the substrate receiving surface 132 of the substrate support 130 to be about 30 millimeters or less, or even 15 millimeters or less. Therefore, a variation of the spacing between the substrate receiving surface 132 and the diffuser may adversely affect plasma processing, such as plasma deposition processing film properties and uniformity.

As shown in FIG. 3, the bow or flex of the backing plate 112 does not affect the position of the center area of the diffuser 110 since the center area of the diffuser 112 is supported by the diffuser support members 160 movably disposed through the backing plate 112. The diffuser support members 160 are supported by frame structure 175. The frame structure 175 is disposed outside the chamber interior volume 106. Thus, the position of the center area of the diffuser 112 does not depend on the position of the center area of the backing plate 112. In this manner, bowing, flexing, dropping, sagging, creeping, movement, cracking, and maintenance of the diffuser 110 may be reduced since the center area of the diffuser 110 is supported in a position independent of pressure forces acting on the center area of the backing plate 112. Movement, bowing, or flexing of the backing plate 112 in response to the vacuum pressure applied within the interior volume causes the spacing between the backing plate 112 and the top of the diffuser 110 to vary. The position of the center area of the diffuser 110 remains in substantially the same position. Thus, a more consistent spacing between the diffuser 110 and the substrate receiving surface 132 is maintained even if the backing plates bows or flexes. Therefore, plasma processing is improved and the chamber 100 requires reduced maintenance.

FIGS. 4A-4E show various embodiments of sealing devices 147 associated with the diffuser support members 160 to providing a vacuum seal of the openings 165 of the backing plate. The sealing devices 147 isolate the chamber interior volume 106 from the ambient outside environment while allowing relative movement of the diffuser support member 160 and the backing plate 112.

FIG. 4A shows a sealing device 147A comprising an o-ring 325A sandwiched between a cap 347A and a top side 412 of the backing plate 112. The cap 347A includes an opening 417A formed therein to receive the diffuser support member 160 and may be coupled to the top side 412 of the backing plate 112 by fasteners 410A, such as bolts, screws, and the like. The o-ring 325A seals the opening 165 by being in sliding contact with the diffuser support member 160.

FIG. 4B shows a sealing device 147B comprising an o-ring 325B sandwiched between a cap 347B and the bottom side 413 of the backing plate 112. The cap 347B includes an opening 417B formed therein to receive the diffuser support member 160 and may be coupled to the bottom side 413 of the backing plate 112 by fasteners 410B, such as bolts, screws, and the like. The o-ring 325B seals the opening 165 in the backing plate 112 by being in sliding contact with the diffuser support member 160.

FIG. 4C shows a sealing device 147C comprising an o-ring 325C disposed in a land 420 formed in the backing plate 112. The o-ring 325C seals the opening 165 in the backing plate 112 by being in sliding contact with the diffuser support member 160.

FIG. 4D shows a sealing device 147D comprising an o-ring 325D disposed in a land 421 formed in the diffuser support member 160. The o-ring 325D seals the opening 165 in the backing plate by being in sliding contact with the opening 165 of the backing plate 112.

FIG. 4E shows a sealing device 147E comprising a flexible bellow 402 surround at least a portion of the diffuser support member 160. As shown, the flexible bellow 402 is coupled to the backing plate 112 and to the support ring 148. The flexible bellow 402 can expand or contract due to the variation in the distance between the backing plate 112 and the support ring 148. The flexible bellow 402 may be made of metals, such as steels or aluminum, or a polymer material.

An optional cover 405 may be disposed at least partially around the diffuser support member 160 to provide a vacuum seal between the support ring 148 and the diffuser support member 160.

Figure 5:
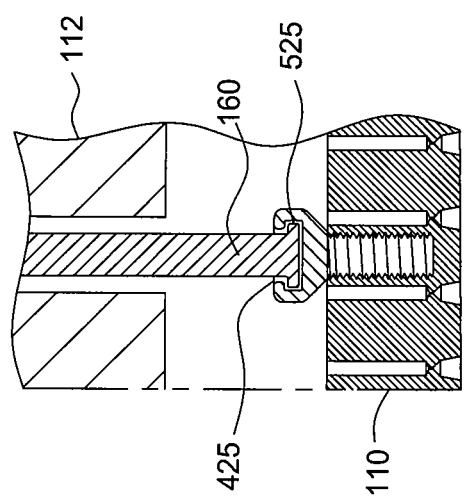
FIG. 5 is a cross-section view of one embodiment of a diffuser support member coupled to a diffuser through a mating mechanism coupled to the diffuser.

FIG. 5 is a cross-section view of one embodiment of a diffuser support member 160 coupled to the diffuser through a mating mechanism 425 coupled to the diffuser 110. The mating mechanism 425 has a cavity adapted to receive and mate with a head portion 525 of the diffuser support member 160. In one aspect, the mating mechanism provides ease of attaching and detaching the mating mechanism 425 from the diffuser support member 160.

Figure 6B:
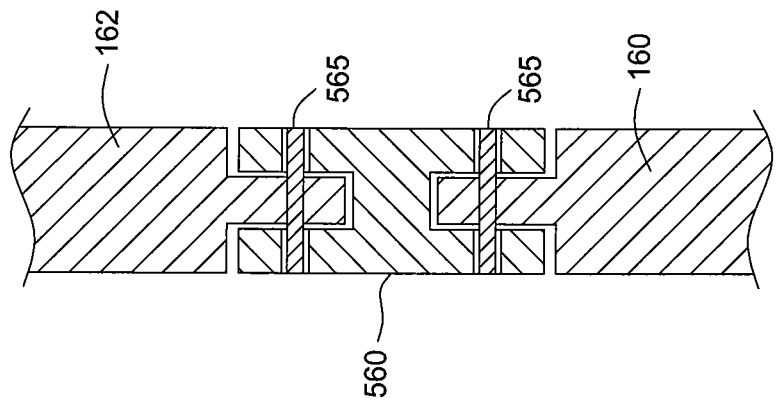
FIG. 6B is a cross-sectional view of one embodiment of a dielectric break to electrically isolate a frame structure from a diffuser support member or reduce the amount of RF current traveling from the backing plate through the diffuser support members to the frame structure.
Figure 6A:
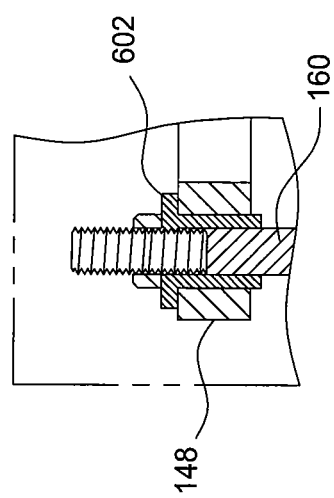
FIG. 6A is a cross-section view of one embodiment of an insulative sleeve disposed at least partially around a diffuser support member.

FIG. 6A is a cross-section view of one embodiment of an insulative sleeve 602 disposed at least partially around the diffuser support member 160 to electrically isolate the frame structure from the diffuser support member 160 or reduce the amount of RF current traveling from the backing plate through the diffuser support members to the frame structure. The insulative sleeve 602 provides an insulative separation between the diffuser support member 160 and the support ring 148 of the coupling assembly 150. In other embodiments (not shown), the diffuser support member may be coupled to support frame with the coupling assembly and the insulative sleeve may provide an insulative separation between the diffuser support member and the support frame.

FIG. 6B is a cross-sectional view of one embodiment of a dielectric break 560 coupled to the diffuser support member 160. The dielectric break electrically isolates the frame structure 175 from the diffuser support member 160 or reduces the amount of RF current traveling from the backing plate 112 through the diffuser support members 160 to the frame structure 175. The dielectric break 560 may receive an end of the diffuser support member 160 and an end of the hanger 162 without the support ring 148 and may be coupled together by a fastener 565, such as a pin, a screw, or a bolt.

Figure 7:
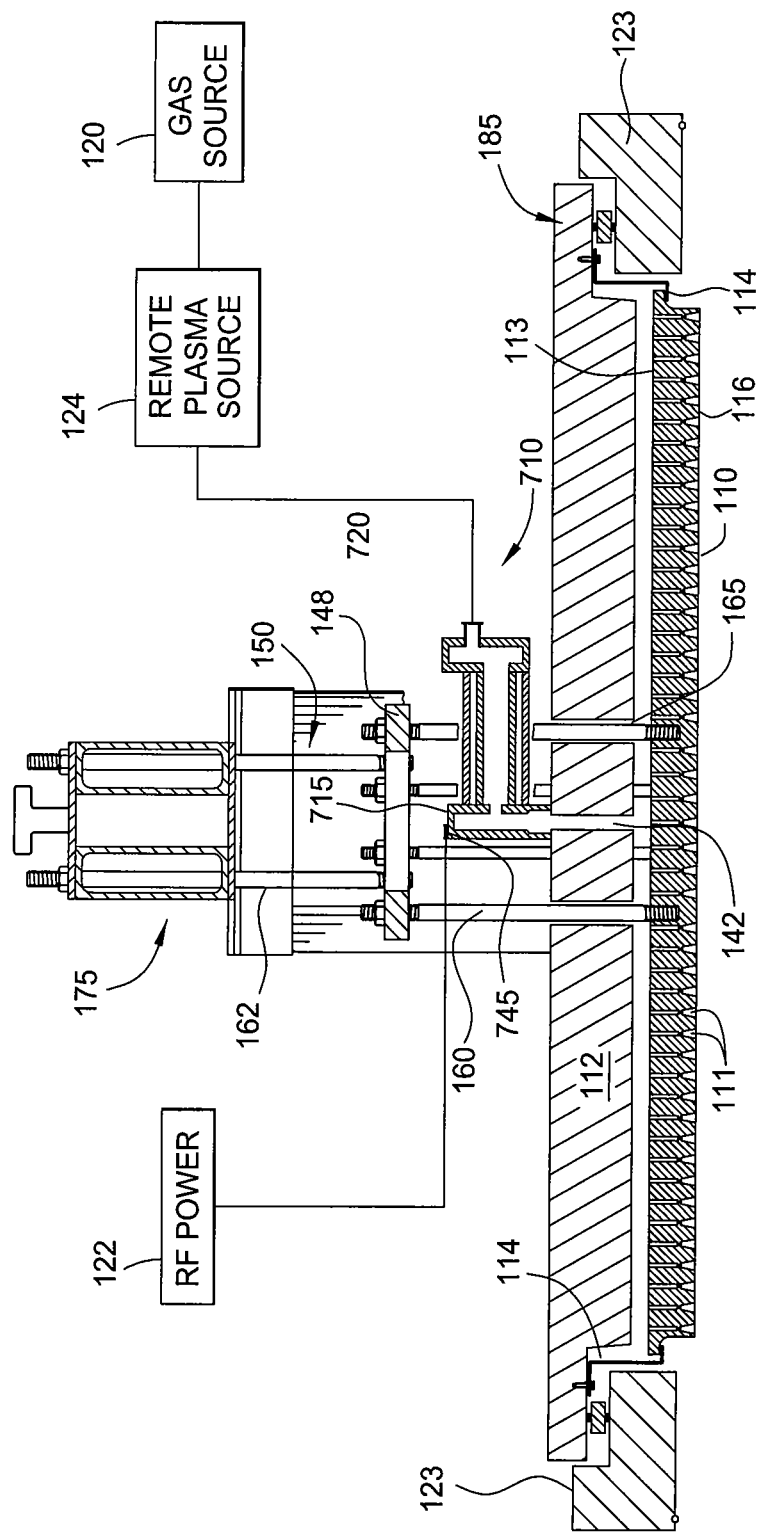
FIG. 7 is a cross-sectional view of one embodiment of a gas feed-through assembly coupled to the gas inlet of the backing plate of FIG. 1.

FIG. 7 is a cross-sectional view of one embodiment of a gas feed-through assembly 710 coupled to the gas inlet 142 of the backing plate 112. The gas feed-through assembly 710 includes an inlet block 715 in fluid communication with the gas inlet 142. The inlet block 715 includes a connector 745 that is coupled to the RF power source 122. The inlet block 715 comprises a conductive material, such as aluminum. RF current provided by the RF power source 112 travels through the inlet block 715, through the backing plate 112, through the flexible suspension 114, and to the diffuser 110. A conduit 740 provides fluid communication between the inlet block 715 and the remote plasma source interface 720. The remote plasma source interface 720 is coupled to the remote plasma source 124 which is coupled to the gas source 120. In one embodiment, the conduit 740 preferably comprises a dielectric material to reduce the amount of RF current traveling from the inlet block 715 therethrough.

Figure 8:
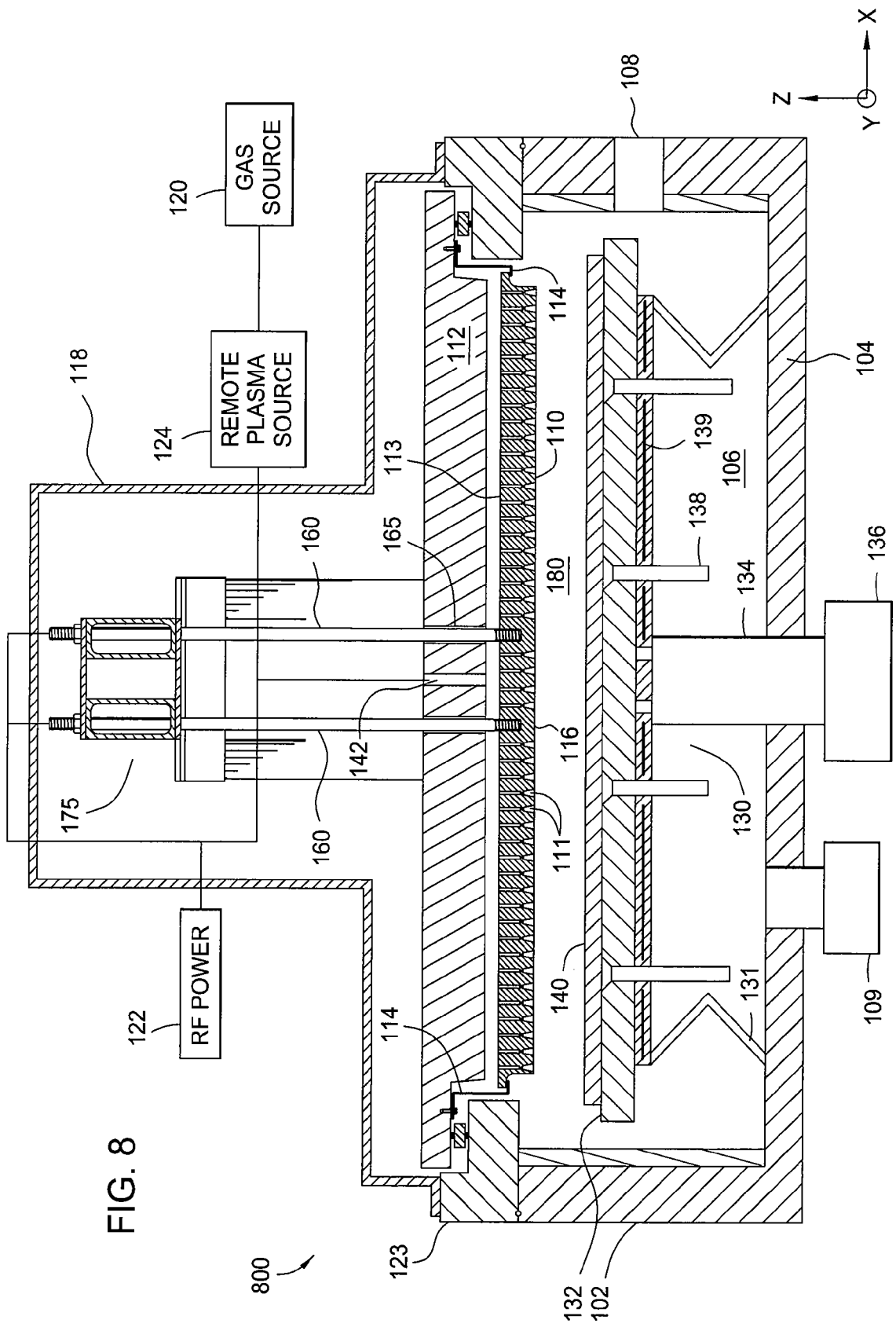
FIG. 8 is a schematic cross-sectional view of another embodiment of a chamber in which diffuser support members are coupled to a support frame.

FIG. 8 is a schematic cross-sectional view of another embodiment of a chamber 900 in which the diffuser support members 160 are directly coupled to the support frame 175. The RF power source 122 may be coupled to the backing plate 112 or may be coupled to one or more of the diffuser support members 160. In either embodiment, the chamber 900 may include a cover 118 adapted to isolate any electrically active portions of the chamber 900. The cover 118 may be extended to the lid 123, which may be at ground potential. In another embodiment (not shown), an insulative sleeve may at least partially surround each diffuser support member 160 to electrically isolate the support frame 175 from the diffuser support members 160.

While the foregoing is directed to embodiments of the present invention, other and further embodiments of the invention may be devised without departing from the basic scope thereof, and the scope thereof is determined by the claims that follow.

The invention claimed is:

1. A gas distribution apparatus for a plasma processing chamber, comprising:
   a backing plate;
   a diffuser disposed downstream of the backing plate;
   a frame structure disposed outside of the plasma processing chamber, the frame structure being spaced apart from the processing chamber by two or more support members; and
   a diffuser support member coupled to the frame structure and the diffuser, the diffuser support member being movably disposed through and spaced apart from the backing plate such that a gap is present therebetween, wherein the backing plate is movable independent of the diffuser when the diffuser is coupled with the diffuser support member and the frame structure.

2. The apparatus of claim 1, wherein the backing plate has an opening and the diffuser support member is movably disposed therethrough.

3. The apparatus of claim 2, further comprising a sealing device disposed on the diffuser support member.

4. The apparatus of claim 3, wherein the sealing device provides a vacuum seal for the opening in the backing plate.

5. The apparatus of claim 1, wherein the diffuser support member is coupled to a center region of the diffuser.

6. The apparatus of claim 5, wherein the center region comprises a region within a radius from the center of the diffuser, wherein the radius is 25% or less of a diagonal dimension of the diffuser.

7. The apparatus of claim 1, wherein the backing plate is coupled to an edge portion of the diffuser by a suspension member.

8. A plasma processing apparatus, comprising:
   a chamber body including a bottom and walls;
   a backing plate disposed over the chamber body;
   a chamber interior volume bounded by the chamber body and the backing plate;
   a frame structure disposed outside of the chamber body and spaced apart from the backing plate, the frame structure comprising a length that is equal to a length or a width of the chamber body, and a width that is less than a width of the chamber body;
   a diffuser disposed within the chamber interior volume;
   a coupling assembly disposed between the backing plate and the frame structure, and coupled to the frame structure by one or more fasteners; and
   a diffuser support member coupled to the diffuser and the coupling assembly, the diffuser support member disposed between the diffuser and the coupling assembly and movably disposed through the backing plate and spaced apart from the backing plate such that a gap is present therebetween.

9. The apparatus of claim 8, wherein the frame structure is electrically isolated from the diffuser support member.

10. The apparatus of claim 8, wherein the coupling assembly comprises a ring.

11. The apparatus of claim 8, wherein the coupling assembly comprises a hanger coupled to the frame structure and a support ring coupled to the hanger and the diffuser support member.

12. The apparatus of claim 11, wherein the support ring comprises an insulative material.

13. The apparatus of claim 11, wherein the support ring comprises a conductive material.

14. A plasma processing apparatus, comprising:
   a chamber body having a lid, a bottom, walls, and a backing plate coupled to the lid defining a chamber interior volume;
   a frame structure disposed outside of the chamber body and spaced apart from the chamber lid by two or more support members, the frame structure comprising a length that is equal to a length or a width of the chamber body, and a width that is less than a width of the chamber body;
   a diffuser disposed within the chamber interior volume, an edge portion of the diffuser being coupled to the backing plate by a suspension member; and
   at least one diffuser support member extending between the frame structure and the diffuser through an opening in the backing plate, the diffuser support member being spaced apart from the backing plate such that a gap is present between the opening and the diffuser support member that facilitates support of the diffuser independent from the backing plate such that the backing plate is movable relative to the diffuser while the diffuser is coupled to the at least one diffuser support member.

15. The apparatus of claim 14, wherein the diffuser is electrically coupled to the backing plate.

16. The apparatus of claim 14, wherein the opening in the backing plate comprises a sealing device.

17. The apparatus of claim 16, wherein the sealing device provides a vacuum seal for the opening in the backing plate.

18. The apparatus of claim 14, wherein the diffuser support member is coupled to a center region of the diffuser.

19. The apparatus of claim 14, wherein the center region comprises a region within a radius from the center of the diffuser, wherein the radius is 25% or less of a diagonal dimension of the diffuser.

* * * * *